United States Patent
Tsai et al.

(10) Patent No.: US 8,416,968 B2
(45) Date of Patent: Apr. 9, 2013

(54) AUDIO DEVICE AND AUDIO INPUT/OUTPUT METHOD

(75) Inventors: Chung-Hang Tsai, HsinChu (TW); Wei-Cheng Tang, HsinChu (TW)

(73) Assignee: Realtek Semiconductor Corp., Hsinchu (TW)

( * ) Notice: Subject to any disclaimer, the term of this patent is extended or adjusted under 35 U.S.C. 154(b) by 605 days.

(21) Appl. No.: 12/548,968

(22) Filed: Aug. 27, 2009

(65) Prior Publication Data
US 2010/0054500 A1  Mar. 4, 2010

(30) Foreign Application Priority Data

Aug. 27, 2008 (TW) .............................. 97132806 A

(51) Int. Cl.
*H03F 99/00* (2009.01)
(52) U.S. Cl. ............ 381/120; 381/28; 381/314; 381/74; 381/123; 330/9; 330/122
(58) Field of Classification Search ............... 381/26, 381/28, 314, 323, 74, 81, 85, 91, 102, 119, 381/120, 122, 123, 71.6, 113, 111; 710/8, 710/12, 14, 31, 46; 330/9, 78, 122, 129, 330/130, 136, 261, 267, 273, 285, 296, 96, 330/123, 127, 134; 700/94
See application file for complete search history.

(56) References Cited

U.S. PATENT DOCUMENTS

| | | | | |
|---|---|---|---|---|
| 3,476,882 A | * | 11/1969 | Feinerman et al. | 455/462 |
| 6,069,959 A | * | 5/2000 | Jones | 381/71.6 |
| 6,392,476 B1 | * | 5/2002 | Rodriguez | 330/10 |
| 7,970,154 B2 | * | 6/2011 | Akino | 381/113 |
| 7,978,863 B2 | * | 7/2011 | Kuiri | 381/111 |
| 2008/0159567 A1 | * | 7/2008 | Lesso et al. | 381/120 |

FOREIGN PATENT DOCUMENTS

| | | |
|---|---|---|
| JP | 59-059487 | 4/1984 |
| JP | 10136483 | 5/1998 |
| JP | 10215300 | 8/1998 |
| JP | 2006191359 | 7/2006 |

OTHER PUBLICATIONS

SIPO Office Action dated Jun. 13, 2012.

* cited by examiner

*Primary Examiner* — Vivian Chin
*Assistant Examiner* — Leshui Zhang
(74) *Attorney, Agent, or Firm* — McClure, Qualey & Rodack, LLP

(57) ABSTRACT

An audio device and an audio input/output method are described, which is coupled to an audio port, and includes a capacitor, a load, an output amplifying module, and an input amplifying module. The capacitor and the load are coupled to the audio port. The output amplifying module is operated at a first working voltage, for outputting a first audio signal to the audio port. A direct current (DC) level of the first audio signal is substantially zero volts. The input amplifying module is operated at a second working voltage, in order to receive a second audio signal from the audio port. When the audio port is in an output state, the output amplifying module is enabled and the input amplifying module is disabled, and when the audio port is in an input state, the input amplifying module is enabled and the output amplifying module is disabled.

20 Claims, 5 Drawing Sheets

AUDIO DEVICE AND AUDIO INPUT/OUTPUT METHOD

CROSS-REFERENCES TO RELATED APPLICATIONS

This non-provisional application claims priority under 35 U.S.C. §119(a) on Taiwan Patent Application No(s). 97132806 filed in Taiwan, R.O.C. on Aug. 27, 2008, the entire contents of which are hereby incorporated by reference.

BACKGROUND

1. Technical Field

The disclosure relates to an audio device and an audio input/output method, and more particularly to an audio device capable of saving a capacitor and an audio input/output method thereof.

2. Related Art

An audio system has a so-called re-tasking mechanism, that is, the same audio port may be set by a user according to actual requirements to input or output an audio signal. In other words, the audio port is capable of both inputting and outputting an audio signal.

In the conventional re-tasking mechanism, the audio port is connected to two operational (OP) amplifiers respectively, these being an output OP amplifier and an input OP amplifier. For both the output and input OP amplifier external circuits of the two amplifiers are respectively connected to one large capacitor or share one large capacitor, and direct current (DC) components in the audio signals are then filtered by the respectively connected capacitors or the shared large capacitor, such that the capacitors may be called DC blocking capacitors.

However, whether or not the structure requires that the output or the input amplifier be respectively connected to one capacitor, or the structure requires that the output and the input amplifier share one capacitor having a relatively large capacitance, the amplifiers place a high demand on the number of capacitors or on the capacitance of the shared capacitor, resulting in an undesirable cost. Further, the DC blocking capacitor may easily cause popping noises during outputting, and thus an external OP amplifier is generally added to eliminate the popping noises, increasing costs.

Therefore, there is an urgent need for solutions to eliminate the problems derived from the audio port having input and output functions in the audio system, so as to obtain a desired audio quality.

SUMMARY

Accordingly, the disclosure is directed to an audio device and an audio input/output method. The audio device is coupled to an audio port having input and output functions. Although the audio device only employs one capacitor, and does not need an external OP amplifier for eliminating the popping noises, a desired audio quality is still obtained.

An audio device according to an embodiment of the disclosure is provided. The audio device is coupled to an audio port, and includes a capacitor, a load, an output amplifying circuit, and an input amplifying circuit. The capacitor is coupled to the audio port. The load is coupled to the audio port. The output amplifying circuit is operated at a first working voltage, for outputting a first audio signal to the audio port. The first working voltage includes a first positive voltage and a first negative voltage such that the direct current (DC) level of the first audio signal is substantially zero volts. The input amplifying circuit is operated at a second working voltage, to receive a second audio signal from the audio port. When the audio port is in an output state, the output amplifying circuit is enabled and the input amplifying circuit is disabled, and when the audio port is in an input state, the input amplifying circuit is enabled and the output amplifying circuit is disabled.

An audio input/output method is also provided. The method includes the steps of: providing a capacitor and a load coupled to an audio port; providing an output amplifying circuit and an input amplifying circuit; operating the output amplifying circuit at a first working voltage, so as to output a first audio signal to the audio port, in which a DC level of the first audio signal is substantially zero volts; operating the input amplifying circuit at a second working voltage, so as to receive a second audio signal from the audio port, wherein the first working voltage is different from the second working voltage; enabling the output amplifying circuit and disabling the input amplifying circuit, when the audio port is in an output state; and enabling the input amplifying circuit and disabling the output amplifying circuit, when the audio port is in an input state.

An audio device is further provided. The audio device is coupled to an audio port, and includes a capacitor, a load, an output amplifying circuit, and an input amplifying circuit. The capacitor is coupled to the audio port. The load is coupled to the audio port. The output amplifying circuit is operated at a first working voltage, to output a first audio signal to the audio port. The input amplifying circuit is operated at a second working voltage, for receiving a second audio signal from the audio port. When the audio port is in an output state, the output amplifying circuit is enabled and the input amplifying circuit is disabled, and when the audio port is in an input state, the input amplifying circuit is enabled and the output amplifying circuit is disabled. The first working voltage is different from the second working voltage.

Preferred embodiments of the disclosure and efficacies thereof are described below with the accompanying drawings.

BRIEF DESCRIPTION OF THE DRAWINGS

The disclosure will become more fully understood from the detailed description given herein below for illustration only, and thus not limitative of the disclosure, wherein.

DETAILED DESCRIPTION

Figure 1:
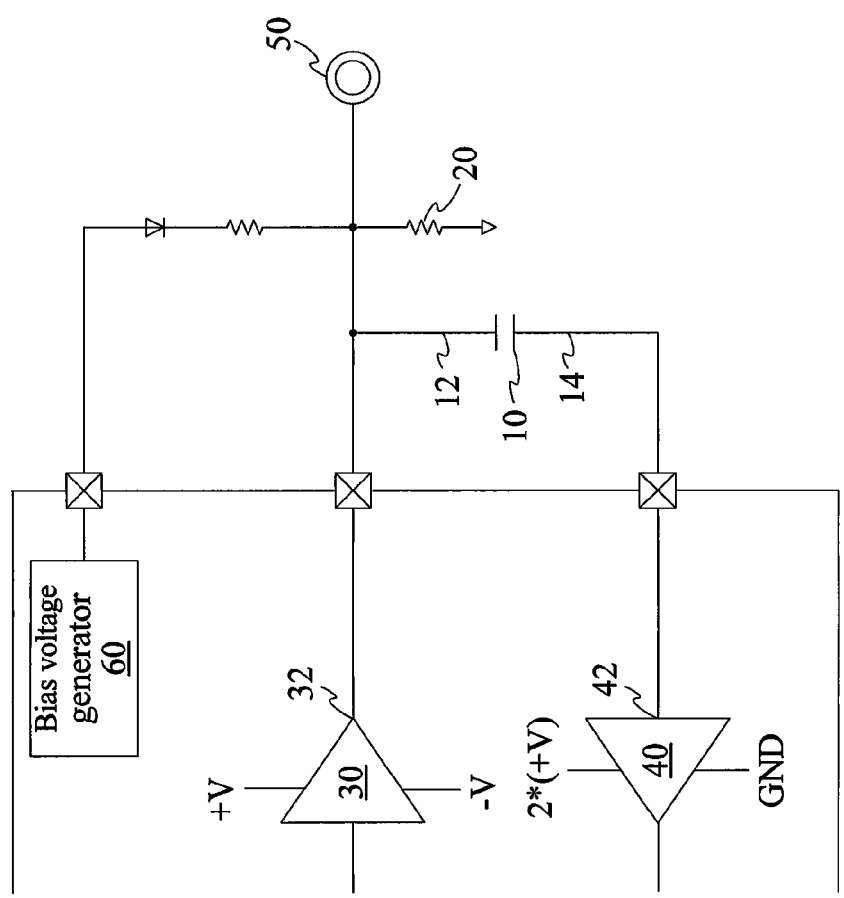
FIG. 1 is a schematic view of an audio device according to an embodiment of the disclosure.

Having summarized various aspects of the present disclosure, reference will now be made in detail to the description of the disclosure as illustrated in the drawings. While the disclosure will be described in connection with these drawings, there is no intent to limit it to the embodiment or embodiments disclosed herein. On the contrary, the intent is to cover all alternatives, modifications and equivalents included within the spirit and scope of the disclosure as defined by the appended claims.

To illustrate certain embodiments of the present invention in the context of a particular application, reference is made to FIG. 1, which is a schematic view of an audio device according to an embodiment of the disclosure. The audio device of the disclosure is coupled to an audio port 50, and includes a capacitor 10, a load 20, an output OP amplifier 30, and an input OP amplifier 40. The audio port 50 is used to input or output an audio signal.

The capacitor 10 has a first end 12 and a second end 14, of which the first end 12 is coupled to the audio port 50. It can be seen from FIG. 1 that the output OP amplifier 30 and the input OP amplifier 40 in the audio device of the disclosure share one capacitor 10, and due to circuit characteristics of the input OP amplifier 40, the impedance of the internal resistance is relatively high, so the coupled capacitor 10 in the disclosure may have a small capacitance. As compared with the prior art, the large capacitor originally connected between the output OP amplifier 30 and the an audio port 50 can be omitted, and the cost resulting from the use of a large capacitor and the external OP amplifier is also reduced. In addition, the output amplifier 30 operates a first working voltage and is adapted to output an audio source signal (hereinafter referred to as an output audio signal), to the audio port 50, and the input amplifier 40 operates a second working voltage and is adapted to receive an audio source signal (hereinafter referred to as an input audio signal), from the audio port 50.

One end of the load 20 is coupled between the first end 12 of the capacitor 10 and the audio port 50. The bias voltage generator 60 is used to provide a bias voltage to a microphone. The load 20 and the bias voltage generator 60 will be further described in detail below.

An output end 32 of the output OP amplifier 30 is coupled to the first end 12 of the capacitor 10, and an input end 42 of the input OP amplifier 40 is coupled to the second end 14 of the capacitor 10. As the audio port 50 has two different functions respectively in an output state and an input state, in the disclosure, when the audio port 50 is in the output state, the output OP amplifier 30 is enabled and the input OP amplifier 40 is disabled, and when the audio port 50 is in the input state, the input OP amplifier 40 is enabled and the output OP amplifier 30 is disabled.

Next, various implementation aspects in the input/output state are exemplified, so as to illustrate the operation manner of the audio device of the disclosure. Here, the output OP amplifier 30 receives a first positive voltage (+V), and a first negative voltage (−V), and the first working voltage of the output OP amplifier 30 is determined according to the first positive voltage and the first negative voltage. The input OP amplifier 40 receives a second positive voltage (+2V), and a ground voltage (GND), and the second working voltage of the input OP amplifier 40 is determined according to the second positive voltage and the ground voltage. A magnitude of the second positive voltage (+2V) is substantially twice a magnitude of the first positive voltage (+V). A mean of the first positive voltage (+V) and the first negative voltage (−V) is substantially equal to zero. The difference of the first positive voltage (+V) and the first negative voltage (−V) is substantially equal to a difference of the second positive voltage (+2V) and the ground voltage, which is +2V.

As will be appreciated by persons skilled in the art, the first working voltage (+V~−V) and the second working voltage (+2V~GND) may be generated in a variety of ways, and therefore detailed illustrations and discussions of such circuitry need not be described herein. One embodiment for generating the first working voltage (+V~−V) and the second working voltage (+2V~GND) can refer to the patent: "Driver Amplifier Circuit" by WANG; Tze-Chien, filed in the U.S. Pat Office in Feb. 14, 2008, Ser. No. 12/031,522.

Please refer to FIG. 1, the bias voltage generator 60 is coupled to the audio port 50 through a diode and a resistor.

Figure 2A:
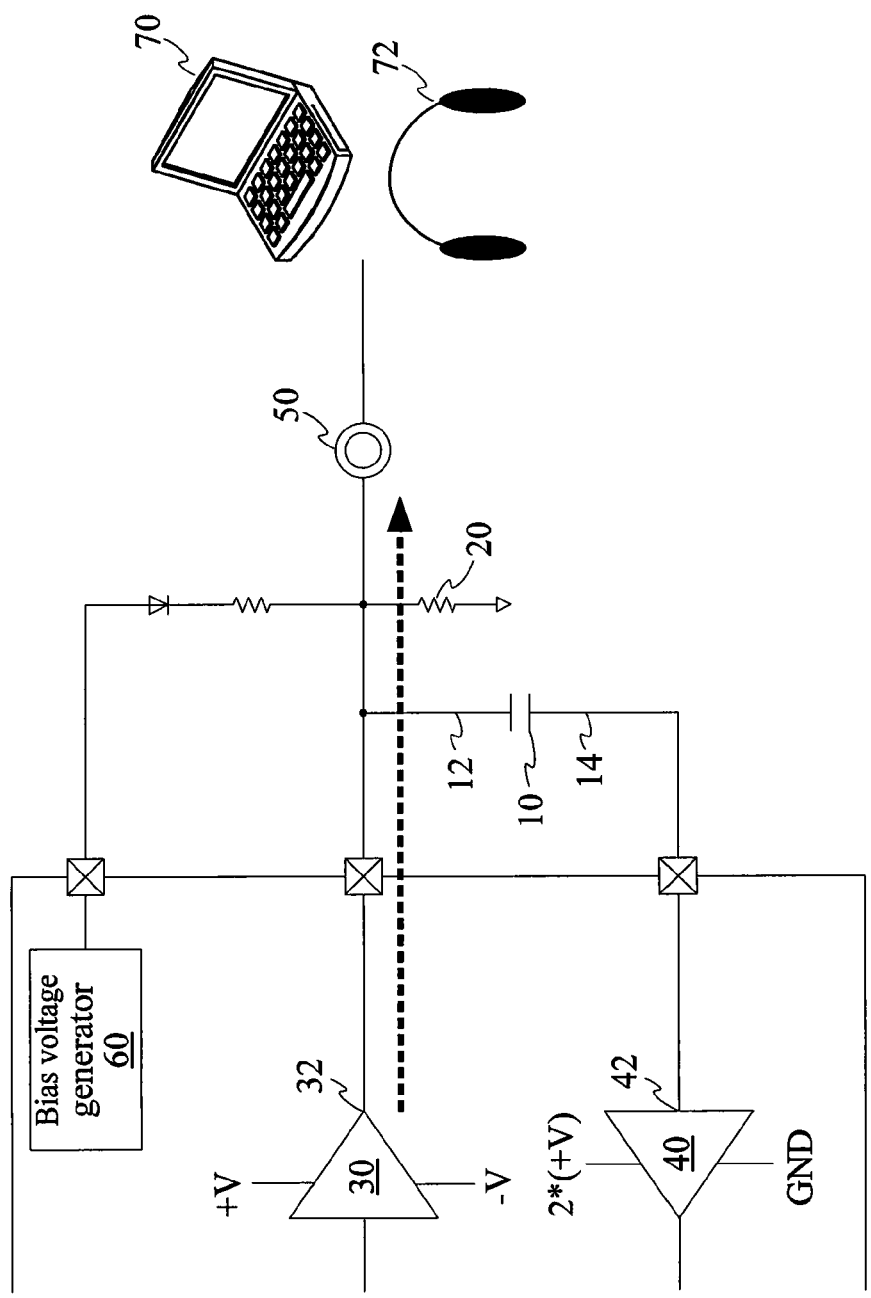
FIG. 2A is a schematic view of the audio device in an output state according to the disclosure.

FIG. 2A is a schematic view of the audio device in an output state according to the disclosure. When the audio port 50 is in the output state, the input OP amplifier 40 is disabled, the bias voltage generator 60 is switched to a high impedance and is in an open-circuit state (i.e., the bias voltage generator 60 is disabled), and then the output OP amplifier 30 is enabled, such that the output audio signal may be successfully output to the audio port 50, and further transmitted to an external device connected to the audio port 50. The external device is, for example, a computer 70 or an earphone 72 as shown in the figure, which is not limited herein. The computer 70 and the earphone 72 represent two different types of external devices for receiving the audio source signal.

The positive voltage received by the output OP amplifier 30 may be +2.5 volt, and the negative voltage may be −2.5 volt, that is, a first working voltage of the output OP amplifier 30 is in a range of +2.5 volt to −2.5 volt, which is not limited hereto. In other words, the DC voltage level of the output OP amplifier is zero voltage. It can be further seen from the figure that the positive voltage received by the input OP amplifier 40 is twice the positive voltage (2*V) received by the output OP amplifier 30, and the negative voltage is a grounding (GND) voltage. As seen from above, the positive voltage received by the input OP amplifier 40 is +5 volt, that is, a second working voltage of the input OP amplifier 40 is in a range of 0 to 5 volt, which is not limited hereto. In other words, the DC voltage level of the input OP amplifier is half of the positive voltage when the negative voltage is the grounding (GND) voltage. Besides, the first working voltage is different from the second working voltage.

As the first working voltage of the output OP amplifier 30 is in a range of +2.5 volt to −2.5 volt, a DC voltage level of the output audio signal transmitted by the output OP amplifier 30 is zero volts. In the prior art, an amplitude of the output audio signal transmitted by the output OP amplifier is generally set between 0 and 5 volt, so that the DC voltage level thereof is 2.5 volt, and as the DC voltage level of the output audio signal is not zero volts, popping noises are easily generated. Therefore, in the disclosure, the DC voltage level of the output audio signal transmitted by the output OP amplifier 30 is set to zero volts, so as to eliminate the popping noises. In this manner, as compared with the prior art, the disclosure omits an external OP amplifier employed to eliminate the popping noises, and further reduces the cost.

Figure 2B:
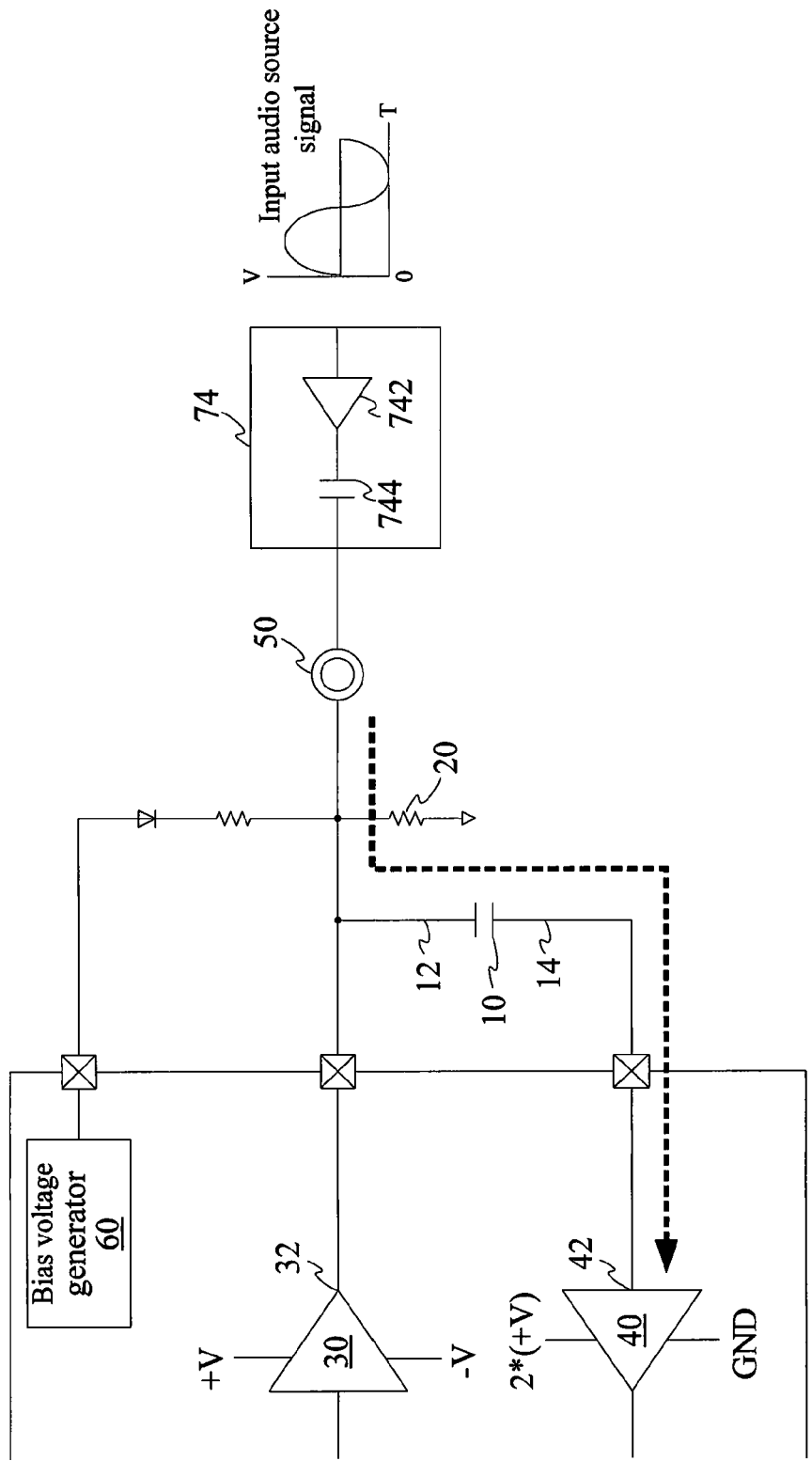
FIG. 2B is a schematic view (1) of the audio device in an input state according to the disclosure.

FIG. 2B is a schematic view (1) of the audio device in an input state according to the disclosure. In this embodiment the audio device is in an input state, and an audio source supply device 74 provides an input audio signal. The audio source supply device 74 has an OP amplifier 742 coupled to a capacitor 744, so as to transmit the input audio signal to the audio port 50. At this point, the bias voltage generator 60 and the output OP amplifier 30 are disabled, then the input OP amplifier 40 is enabled such that the input audio signal is successfully transmitted to the input OP amplifier 40. In this case, the disabled state of the output OP amplifier 30 is similar to an open-circuit state, which is referred to particularly as a floating state in the disclosure.

A detecting circuit may be adapted to detect whether the audio port 50 is currently in the input state or the output state, and send a state signal to notify the audio device of the disclosure. Thereby, the audio device of the disclosure determines whether or not to disable the output OP amplifier 30 according to the state signal. The above manner is wellknown to those skilled in the art, and the details will not be described again herein. There are certainly many methods for determining the current state of the audio port 50, but in consideration of the length of the specification, only one example is given below, and the disclosure is not limited thereto.

Moreover, before being transmitted to the input OP amplifier 40, the input audio signal first passes through a path composed of the capacitor 744 and the capacitor 10, and in the circuit characteristics, a voltage between two serially connected capacitors is unknown, i.e., it is difficult to determine when the input audio signal passes through the path composed of the capacitor 744 and the capacitor 10, the DC voltage level of the input audio signal. Therefore, in the disclosure a load 20 is coupled between the two capacitors, so as to adjust the DC voltage level of the input audio signal. The load 20 must be set to a relatively large impedance value, for example, 47 KΩ, which is not limited hereto.

Figure 2C:
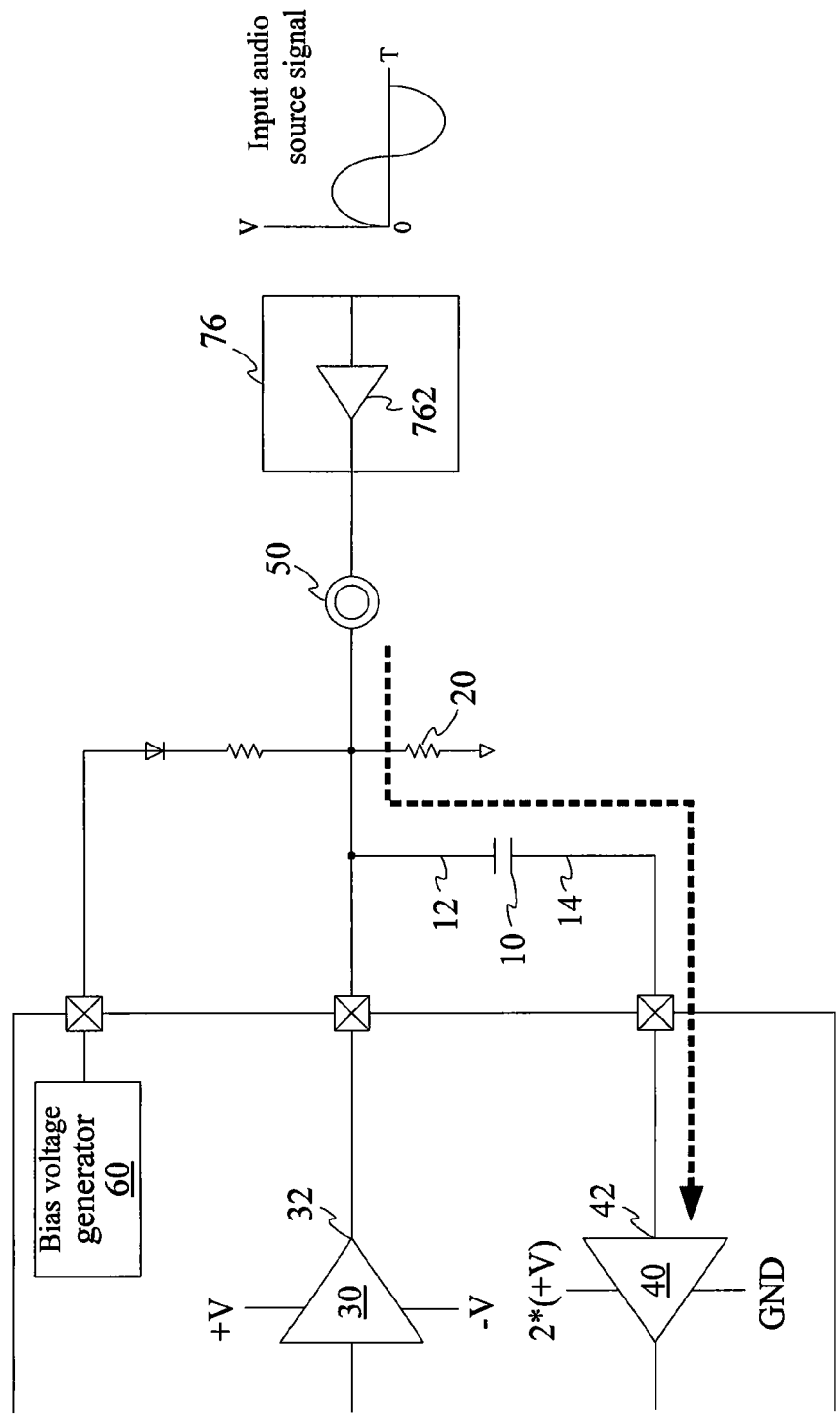
FIG. 2C is a schematic view (2) of the audio device in an input state according to the disclosure.

FIG. 2C is a schematic view (2) of the audio device in an input state according to the disclosure. The difference between FIGS. 2C and 2B lies only in the fact that, the audio source supply device 76 in FIG. 2C adopts the audio device capable of saving a capacitor provided by the disclosure, so that the OP amplifier 762 in the audio source supply device 76 does not need to be coupled to a capacitor. The output OP amplifier 30 and the bias voltage generator 60 are disabled, and the input OP amplifier 40 is enabled, such that the input audio signal is successfully transmitted to the input OP amplifier 40 from the audio port 50. Further, as the load 20 has a high impedance, the DC voltage level of the input audio signal does not need to be adjusted even during the implementation, and the current barely passes through the load 20, thus resulting in no additional power consumption.

Figure 2D:
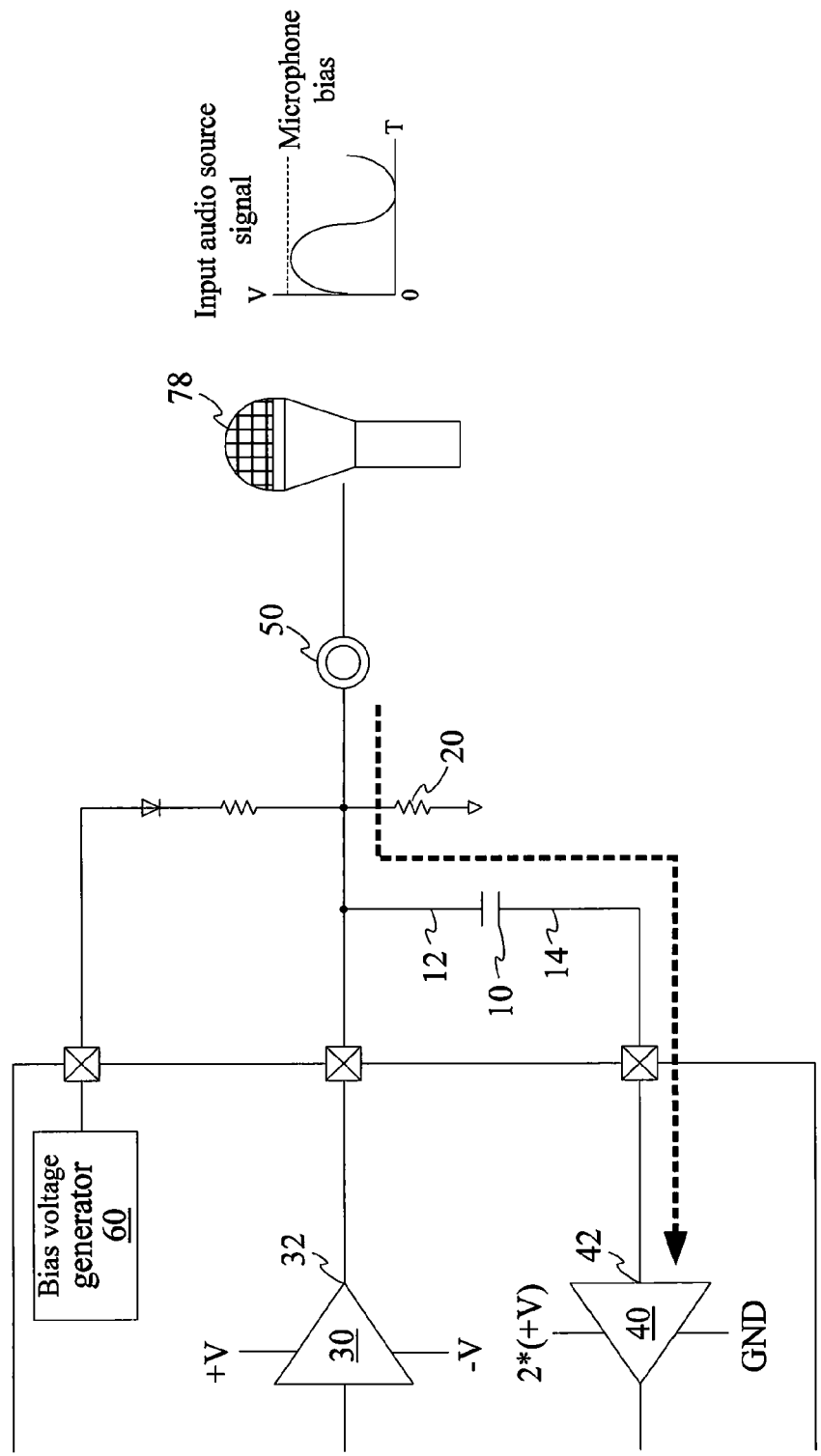
FIG. 2D is a schematic view (3) of the audio device in an input state according to the disclosure.

FIG. 2D is a schematic view (3) of the audio device in an input state according to the disclosure. In this embodiment, a microphone 78 is used to provide an input audio signal. In the input state, the output OP amplifier 30 is disabled, the input OP amplifier 40 is enabled, and the bias voltage generator 60 is enabled to provide a microphone bias to the input audio signal, so as to ensure the audio quality. The microphone bias provided by the bias voltage generator 60 determines an amplitude of the input audio signal input by the microphone 78. For example, it is assumed that the microphone bias provided by the bias voltage generator 60 is 3 volt, and thus the amplitude of the input audio signal input by the microphone 78 is controlled to be lower than 3 volt. The above description is taken as an example only, and the disclosure is not limited thereto.

While the present invention has been described by the way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. An audio device, coupled to an audio port, comprising:
a capacitor, coupled to the audio port;
a load, coupled to the audio port;
an output amplifying circuit, operated at a first working voltage, for outputting a first audio signal to the audio port, wherein the first working voltage has a first positive voltage and a first negative voltage such that a direct current (DC) level of the first audio signal is substantially zero volts; and
an input amplifying circuit, operated at a second working voltage, for receiving a second audio signal from the audio port, wherein when the audio port is in an output state, the output amplifying circuit is enabled and the input amplifying circuit is disabled, and when the audio port is in an input state, the input amplifying circuit is enabled and the output amplifying circuit is disabled, wherein an output of the output amplifying circuit is coupled to a first end of the capacitor and an input of the input amplifying circuit is coupled to a second end of the capacitor.

2. The audio device according to claim 1, further comprising: a bias voltage generating circuit, to provides a bias voltage to the audio port, wherein when the audio port is in the output state, the bias voltage generating circuit is disabled.

3. The audio device according to claim 2, wherein when the audio port is in a microphone input state, the bias voltage generating circuit is enabled.

4. The audio device according to claim 2, wherein the bias voltage generating circuit is coupled to the audio port through a diode and a resistor.

5. The audio device according to claim 1, wherein the second working voltage comprises a second positive voltage and a ground voltage, wherein the second positive voltage is larger than the first positive voltage.

6. The audio device according to claim 4, wherein a magnitude of the second positive voltage is substantially twice a magnitude of the first positive voltage.

7. The audio device according to claim 1, wherein a mean of the first positive voltage and the first negative voltage is substantially equal to zero.

8. The audio device according to claim 1, wherein the load is configured to adjust a DC voltage level of the second audio signal received from the audio port, and wherein the load is coupled to the first end of the capacitor.

9. An audio input/output method, comprising:
providing a capacitor and a load coupled to an audio port;
providing an output amplifying circuit and an input amplifying circuit, wherein an output of the output amplifying circuit is coupled to a first end of the capacitor and an input of the input amplifying circuit is coupled to a second end of the capacitor;
operating the output amplifying circuit at a first working voltage, so as to output a first audio signal to the audio port, wherein a direct current (DC) level of the first audio signal is substantially zero volts;
operating the input amplifying circuit at a second working voltage so as to receive a second audio signal from the audio port;
enabling the output amplifying circuit and disabling the input amplifying circuit, when the audio port is in an output state; and
enabling the input amplifying circuit and disabling the output amplifying circuit, when the audio port is in an input state.

10. The method according to claim 9, wherein the first working voltage is different from the second working voltage.

11. The method according to claim 9, further comprising: providing a bias voltage to the audio port, when the audio port is in a microphone input state.

12. The method according to claim 11, further comprising: stopping providing the bias voltage to the audio port, when the audio port is in an output state.

13. The method according to claim 9, wherein the first working voltage comprises a first positive voltage and a first negative voltage, and a mean of the first positive voltage and the first negative voltage is substantially equal to zero.

14. An audio device, coupled to an audio port, comprising:
a capacitor, coupled to the audio port;
a load, coupled to the audio port;
an output amplifying circuit, operated at a first working voltage, to output a first audio signal to the audio port, wherein the output amplifying circuit operates at the first working voltage such that a direct current (DC) level of the first audio signal is substantially zero volt; and
an input amplifying circuit, operated at a second working voltage the for receiving a second audio signal from the audio port, wherein the first working voltage is substantially different from the second working voltage;
wherein when the audio port is in an output state, the output amplifying circuit is enabled and the input amplifying circuit is disabled, when the audio port is in an input state, the input amplifying circuit is enabled and the output amplifying circuit is disabled, wherein an output of the output amplifying circuit is coupled to a first end of the capacitor and an input of the input amplifying circuit is coupled to a second end of the capacitor.

15. The audio device according to claim 14, further comprising: a bias voltage generating circuit, to provide a bias voltage to the audio port, wherein when the audio port is in the output state, the bias voltage generating circuit is disabled.

16. The audio device according to claim 15, wherein when the audio port is in a microphone input state, the bias voltage generating circuit is enabled.

17. The audio device according to claim 15, wherein the load is coupled to the bias voltage generating circuit via a diode and a resistor.

18. The audio device according to claim 14, wherein a direct current (DC) level of the first audio signal is substantially zero volts.

19. The audio device according to claim 14, wherein the first working voltage comprises a first positive voltage and a first negative voltage, and the second working voltage comprises a second positive voltage and a ground voltage, wherein the second positive voltage is larger than the first positive voltage.

20. The audio device according to claim 19, wherein a difference of the first positive voltage and the first negative voltage is substantially equal to a difference of the second positive voltage and the ground voltage.

* * * * *